(12) United States Patent
Ma et al.

(10) Patent No.: US 10,763,449 B2
(45) Date of Patent: Sep. 1, 2020

(54) ORGANIC LIGHT-EMITTING DIODE (OLED) DISPLAY PANEL, FABRICATION METHOD AND ELECTRONIC DEVICE THEREOF

(71) Applicant: Shanghai Tianma AM-OLED Co., Ltd., Shanghai (CN)

(72) Inventors: Huihui Ma, Shanghai (CN); Xiangcheng Wang, Shanghai (CN); Hongyang Ren, Shanghai (CN); Jie Li, Shanghai (CN); Yuji Hamada, Shanghai (CN); Wei He, Shanghai (CN); Chen Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 204 days.

(21) Appl. No.: 15/677,393

(22) Filed: Aug. 15, 2017

(65) Prior Publication Data
US 2017/0346032 A1 Nov. 30, 2017

(30) Foreign Application Priority Data

Mar. 31, 2017 (CN) .......................... 2017 1 0207221

(51) Int. Cl.
*H01L 51/50* (2006.01)
*C09K 11/02* (2006.01)
(Continued)

(52) U.S. Cl.
CPC ........ *H01L 51/5024* (2013.01); *C09K 11/025* (2013.01); *C09K 11/06* (2013.01);
(Continued)

(58) Field of Classification Search
CPC .................................................. H01L 51/5024
See application file for complete search history.

(56) References Cited

U.S. PATENT DOCUMENTS

2017/0200899 A1* 7/2017 Kim ..................... C09K 11/025

FOREIGN PATENT DOCUMENTS

| CN | 101330129 A | 12/2008 |
|---|---|---|
| CN | 101728485 A | 6/2010 |

(Continued)

*Primary Examiner* — Peter F Godenschwager
(74) *Attorney, Agent, or Firm* — Anova Law Group

(57) ABSTRACT

An OLED display panel is provided. The OLED display panel comprises a first electrode; an opposite second electrode; and a plurality of stacking layers sandwiched between the first electrode and the second electrode. The plurality of stacking layers at least comprises a first auxiliary light-emitting layer and a light-emitting layer sequentially disposed on the first electrode. The first auxiliary light-emitting layer comprises a host material and a dopant material, and the dopant material comprises a compound of the following chemical formula (I):

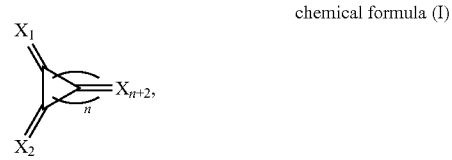

where n is an integer equal to or larger than 1, $X_1$, $X_2$ and $X_{n+2}$ each independently has a chemical structure of (Continued)

R' is selected from any one of a substituted aryl group and a substituted heteroaryl group, and a substituent in the substituted aryl group and a substituent in the substituted heteroaryl group each includes at least one electron acceptor group.

11 Claims, 4 Drawing Sheets

(51) Int. Cl.
  *C09K 11/06* (2006.01)
  *C09K 11/77* (2006.01)
  *H01L 51/00* (2006.01)
  *H01L 51/56* (2006.01)

(52) U.S. Cl.
  CPC ............ *C09K 11/77* (2013.01); *H01L 51/005* (2013.01); *H01L 51/006* (2013.01); *H01L 51/0059* (2013.01); *H01L 51/0072* (2013.01); *C09K 2211/1007* (2013.01); *H01L 51/0058* (2013.01); *H01L 51/5088* (2013.01); *H01L 51/56* (2013.01)

(56) References Cited

FOREIGN PATENT DOCUMENTS

| | | | |
|---|---|---|---|
| CN | 102482574 | A | 5/2012 |
| CN | 101728485 | B | 3/2013 |
| CN | 103187540 | A | 7/2013 |
| CN | 103594659 | A | 2/2014 |
| CN | 104685648 | A | 6/2015 |
| CN | 104752624 | A | 7/2015 |

* cited by examiner

ORGANIC LIGHT-EMITTING DIODE (OLED) DISPLAY PANEL, FABRICATION METHOD AND ELECTRONIC DEVICE THEREOF

CROSS-REFERENCES TO RELATED APPLICATIONS

This application claims the priority of Chinese Patent Application No. CN201710207221.X, filed on Mar. 31, 2017, the entire contents of which are incorporated herein by reference.

FIELD OF THE DISCLOSURE

The present disclosure generally relates to the organic electroluminescent technology and, more particularly, relates to an OLED display panel, a fabrication method and an electronic device thereof.

BACKGROUND

With the advent of the Information Age, conventional cathode ray tube (CRT) displays have been replaced by flat panel displays. One of the most widely used flat panel displays are liquid crystal displays (LCDs), which are featured with proven technology and affordable cost. However, LCDs have technical limitations in terms of contrast, viewing angle, flexibility, and power consumption, etc., because LCDs do not emit light by themselves. Recently, organic light-emitting diodes (OLEDs) are emerging as a new generation of display elements and have attracted a lot of attention, because of their various advantages such as self-luminous, wide viewing angle, fast response, high luminous efficiency, wide color gamut, low operation voltage, thin panel, large size capability and flexibility.

FIG. 1 illustrates a schematic cross-sectional view of an existing OLED display panel. As shown in FIG. 1, the existing OLED display panel includes a substrate (not drawn in FIG. 1), and a light-emitting unit formed on the substrate. The light-emitting unit comprises a transparent anode 7, a cathode 1 composed of a metal or an alloy, and a plurality of organic thin films sandwiched between the anode 7 and the cathode 1. The organic thin films are often categorized in terms of functions. A hole injection layer (HIL) 6, a hole transport layer (HTL) 5, a light-emitting layer (EML) 4, an electron transport layer (ETL) 3, and an electron injection layer (EIL) 2 are often sequentially disposed on the anode 7. Certain OLED display panel also comprises a hole blocking layer (HBL), and an electron blocking layer (EBL), etc.

However, in the existing OLED display panel, some holes in one pixel may flow laterally to adjacent pixels, causing the adjacent pixels to emit light. That is, the lateral leakage is serious. In addition, the hole and electron transport balance in the OLED display panel is highly desired to be improved, thereby improving the luminous efficiency and reducing the power consumption of the OLED display panel.

The disclosed OLED display panel, fabrication method and electronic device thereof are directed to solve one or more problems set forth above and other problems.

BRIEF SUMMARY OF THE DISCLOSURE

One aspect of the present disclosure provides an OLED display panel. The OLED display panel comprises a first electrode; an opposite second electrode; and a plurality of stacking layers sandwiched between the first electrode and the second electrode. The plurality of stacking layers at least comprises a first auxiliary light-emitting layer and a light-emitting layer sequentially disposed on the first electrode. The first auxiliary light-emitting layer comprises a host material and a dopant material, and the dopant material comprises a compound of the following chemical formula (I):

chemical formula (I)

where n is an integer equal to or larger than 1, $X_1$, $X_2$ and $X_{n+2}$ each independently has a chemical structure of

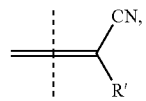

R' is selected from any one of a substituted aryl group and a substituted heteroaryl group, and a substituent in the substituted aryl group and a substituent in the substituted heteroaryl group each includes at least one electron acceptor group.

Another aspect of the present disclosure provides an OLED display panel fabrication method, comprising forming a first electrode on a substrate comprising a plurality of pixel regions emitting light in different colors; forming a first auxiliary light-emitting layer on the first electrode, forming a light-emitting layer on the first auxiliary light-emitting layer; and forming a second electrode on the light-emitting layer. The first auxiliary light-emitting layer comprises a host material and a dopant material, and the dopant material comprises a compound of the following chemical formula (I):

chemical formula (I)

where n is an integer equal to or larger than 1, $X_1$, $X_2$ and $X_{n+2}$ each independently has a chemical structure of

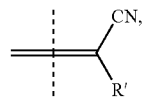

R' is selected from any one of a substituted aryl group and a substituted heteroaryl group, and a substituent in the substituted aryl group and a substituent in the substituted heteroaryl group each includes at least one electron acceptor group.

Another aspect of the present disclosure provides an electronic device comprising an OLED display panel. The OLED display panel comprises a first electrode; an opposite second electrode; and a plurality of stacking layers sandwiched between the first electrode and the second electrode. The plurality of stacking layers at least comprises a first auxiliary light-emitting layer and a light-emitting layer sequentially disposed on the first electrode. The first auxiliary light-emitting layer comprises a host material and a dopant material, and the dopant material comprises a compound of the following chemical formula (I):

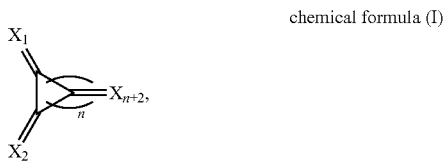

chemical formula (I)

where n is an integer equal to or larger than 1, $X_1$, $X_2$ and $X_{n+2}$ each independently has a chemical structure of

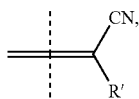

R' is selected from any one of a substituted aryl group and a substituted heteroaryl group, and a substituent in the substituted aryl group and a substituent in the substituted heteroaryl group each includes at least one electron acceptor group.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
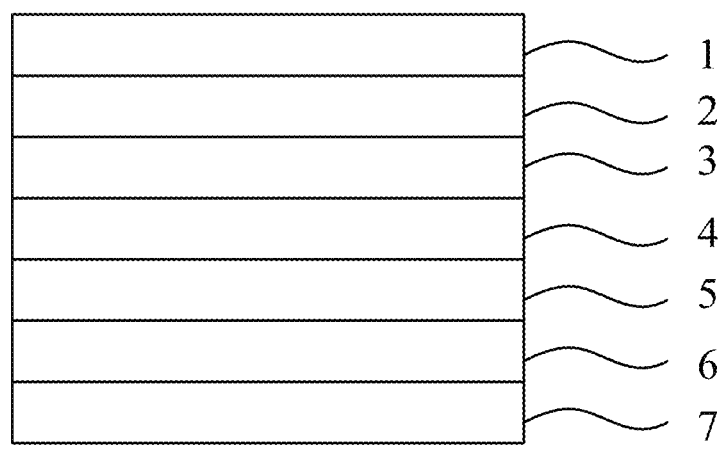
FIG. 1 illustrates a schematic cross-sectional view of an existing OLED display panel.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides an improved OLED display panel comprising a first electrode, a second electrode arranged opposite to the first electrode, and a plurality of stacking layers sandwiched between the first electrode and the second electrode. The plurality of stacking layers at least comprises a first auxiliary light-emitting layer and a light-emitting layer sequentially disposed on the first electrode. The first auxiliary light-emitting layer is formed by guest-host doping technology, in which a radialene compound is doped into a host material as a guest material (or a dopant material or a dopant). The radialene compound has substantially strong hole injection capability, which improves the hole injection speed, thereby reducing the operation voltage, increasing the luminous efficiency, and suppressing the lateral leakage of the OLED display panel.

When no other definition is provided, the term "substituted" used herein means that the hydrogen of the compound is substituted with at least one of the following groups: halogen (F, Cl, Br or I), hydroxy, alkoxy, nitro, cyano, amino, azido, amidino, nitrile, carbonyl, carbamoyl, thiol, ester, carboxyl or salt thereof, sulfonic acid group or salt thereof, phosphoric acid group or salt thereof, $C_1$ to $C_{30}$ alkyl group, $C_2$ to $C_{20}$ alkenyl group, $C_2$ to $C_{20}$ alkynyl group, $C_6$ to $C_{30}$ aryl group, $C_7$ to $C_{20}$ aralkyl group, $C_1$ to $C_8$ alkoxy group, $C_3$ to $C_{20}$ heteroaryl group, and $C_3$ to $C_{30}$ cycloalkyl.

Figure 2:
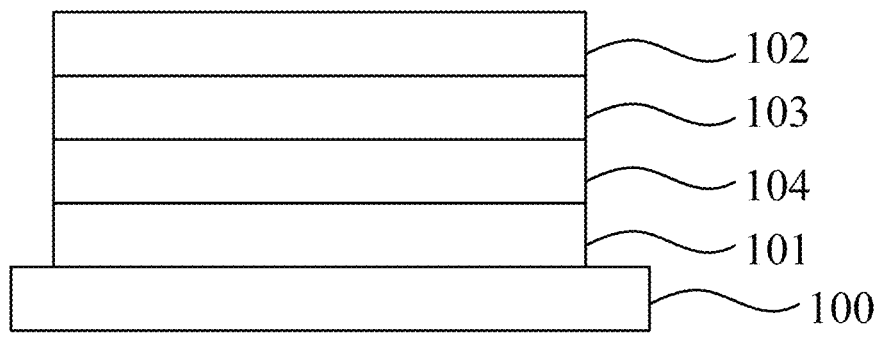
FIG. 2 illustrates a schematic cross-sectional view of an exemplary OLED display panel consistent with the disclosed embodiments.

FIG. 2 illustrates a schematic cross-sectional view of an exemplary OLED display panel consistent with the disclosed embodiments.

As shown in FIG. 2, the OLED display panel may comprise a substrate 100, and a first electrode 101 and a second electrode 102 disposed on the substrate 100. The first electrode 101 may be arranged opposite to the second electrode 102. A light-emitting layer 103 and a first auxiliary light-emitting layer 104 may be disposed between the first electrode 101 and the second electrode 102, and the first auxiliary light-emitting layer 104 may be disposed between the light-emitting layer 103 and the first electrode 101.

The first auxiliary light-emitting layer 104 may at least comprise a first hole-type auxiliary light-emitting layer. The first hole-type auxiliary light-emitting layer may have guest-host doping structure, i.e., comprise a host material (host) and a guest material (dopant), and the dopant may comprise a compound of the following chemical formula (I):

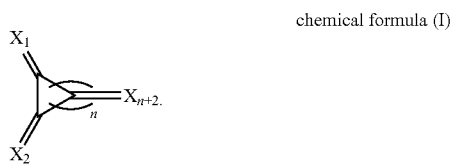

chemical formula (I)

In the chemical formula (I), n is an integer equal to or larger than 1, $X_1$, $X_2$ and $X_{n+2}$ each may independently have a chemical structure of

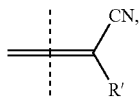

R' may be selected from any one of a substituted aryl group and a substituted heteroaryl group, in which a substituent in the substituted aryl group and a substituent in the substituted heteroaryl group each may include at least one electron acceptor group.

Radialene compounds are used as organic doping agent for doping an organic semiconductive matrix material for changing its electrical properties, as blocking material, as charge injection layer, and as electrode material. In addition, semiconductor material and electronic components including the radialene compounds help the holes to be efficiently injected into the anode having a low work function.

In the disclosed embodiments, the compound of the chemical formula (I) may have a substantially low energetic position of lowest unoccupied molecular orbital (LUMO) and, meanwhile, the compound of the chemical formula (I) may include an electron acceptor group capable of drawing electrons, thereby generating more holes. When the compound of the chemical formula (I) is doped into the host as a dopant, the formed first hole-type auxiliary light-emitting layer may have an improved hole injection capacity, thereby reducing the driving voltage and power consumption of the OLED panel and improving the luminous efficiency of the OLED panel.

In the disclosed embodiments, the first hole-type auxiliary light-emitting layer may be formed by doping the radialene compound into the host material as a dopant material. First, the radialene compound has stronger electron-withdrawing capability, generating more holes and exhibiting stronger hole injection capability. Thus, the hole injection capability of the OLED device may be improved, and the OLED device may be turned on without a substantially high turn-on voltage. As compared with the device in which the radialene compound is not doped into the host material to form the first auxiliary light-emitting layer, the disclosed OLED device, in which the radialene compound is doped into the host material to form the first auxiliary light-emitting layer, may enhance the combination with the electrons. Thus, the injection and transport of holes and electrons in the OLED device may be further balanced, and the luminous efficiency of the OLED device may be improved.

On the other hand, through doping the radialene compound into the host material as the dopant material, the concentration of the radialene compound in the first hole-type auxiliary light-emitting layer may be reduced, such that the holes generated may be quickly recombined with the electrons without migrating towards the adjacent pixel regions. Accordingly, the lateral leakage may be suppressed.

It should be noted that, the first auxiliary light-emitting layer 104 may have a multilayer structure. In addition to the first hole-type auxiliary light-emitting layer which may buffer the hole injection (i.e., the first hole-type auxiliary light-emitting layer may be a hole injection buffer layer), the first auxiliary light-emitting layer 104 may also comprise a hole injection layer (HIL) and a hole transport layer (HTL). In one embodiment, as shown in FIG. 2, the first hole-type auxiliary light-emitting layer may be configured as a hole injection buffer layer, which is for illustrative purposes and is not intended to limit the scope of the present disclosure.

In another embodiment, the first hole-type auxiliary light-emitting layer may be configured as one or more layers of a hole injection buffer layer, a hole injection layer (HIL), hole transport layer (HTL), electron blocking layer (EBL) in the OLED display panel. for example, when the first hole-type auxiliary light-emitting layer is configured as more than one layer of a hole injection buffer layer, a hole injection layer (HIL), hole transport layer (HTL), electron blocking layer (EBL) in the OLED display panel, the first hole-type auxiliary light-emitting may comprise a plurality of sub-layers or may have a multilayer structure. Accordingly, the guest-host doping structure comprising the compound of the chemical formula (I) may also be present in one or more sub-layers of the first auxiliary light-emitting layer 104, depending on the design of the OLED display panels in various application scenarios.

Figure 3:
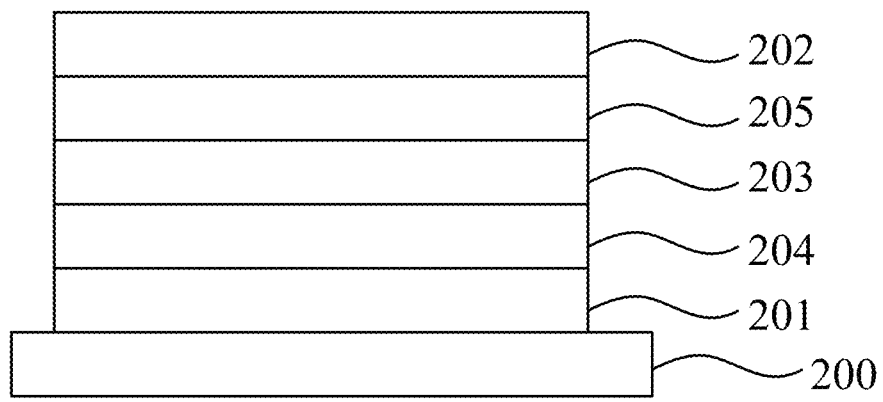
FIG. 3 illustrates a schematic cross-sectional view of another exemplary OLED display panel consistent with the disclosed embodiments.

FIG. 3 illustrates a schematic cross-sectional view of another exemplary OLED display panel consistent with the disclosed embodiments. The similarities between FIG. 2 and FIG. 3 are not repeated here, while certain difference will be explained.

As shown in FIG. 3, the OLED display panel may comprise a substrate 200, and a first electrode 201 and a second electrode 202 disposed on the substrate 200. The first electrode 201 may be arranged opposite to the second electrode 202. A first auxiliary light-emitting layer 204, a light-emitting layer 203, a second auxiliary light-emitting layer 205 may be sequentially disposed on the first electrode 201. The first electrode may be an anode, and the second electrode may be a cathode.

The light-emitting layer 203 may have a first side facing the first auxiliary light-emitting layer 204 and an opposite side. The second auxiliary light-emitting layer 205 may be disposed on the opposite side of the light-emitting layer 203, and the second auxiliary light-emitting layer 205 may be configured for at least one of electron injection and electron transport.

In particular, the second auxiliary light-emitting layer 205 may have a multilayer structure. That is, the second auxiliary light-emitting layer 205 may include, for example, an electron injection layer (EIL), an electron transport layer (ETL), and a hole blocking layer (HIL). The electron injection layer (HIL) in the second auxiliary light-emitting layer 205 may include, for example, lithium fluoride (LiF), cesium fluoride (CsF), lithium oxide (Li2O), and barium oxide (BaO), etc. The electron transport layer (ETL) in the second auxiliary light-emitting layer 205 may include, for example, bis (8-hydroxyquinoline) diphenoxy aluminum, bis (8-hydroxyquinoline) phenoxyaluminum, bis (2-methyl-8-quinolinolato) (2-(2-methyl-8-hydroxyquinoline) phenoxy aluminum, bis (2-(2-hydroxyphenyl) quinoline) zinc, 10-phenanthroline (BCP) (Diarylamino)-1,3,5-triazine, and 3-phenyl-4-(1'-naphthyl)-5-phenyl-1,2,4-triazole, etc.

The first auxiliary light-emitting layer, the light-emitting layer, and the second auxiliary light-emitting layer of the OLED display panel are often formed by vapor deposition, or other well-known film-forming method such as sputtering, spin coating, dipping, and ion plating.

Figure 4:
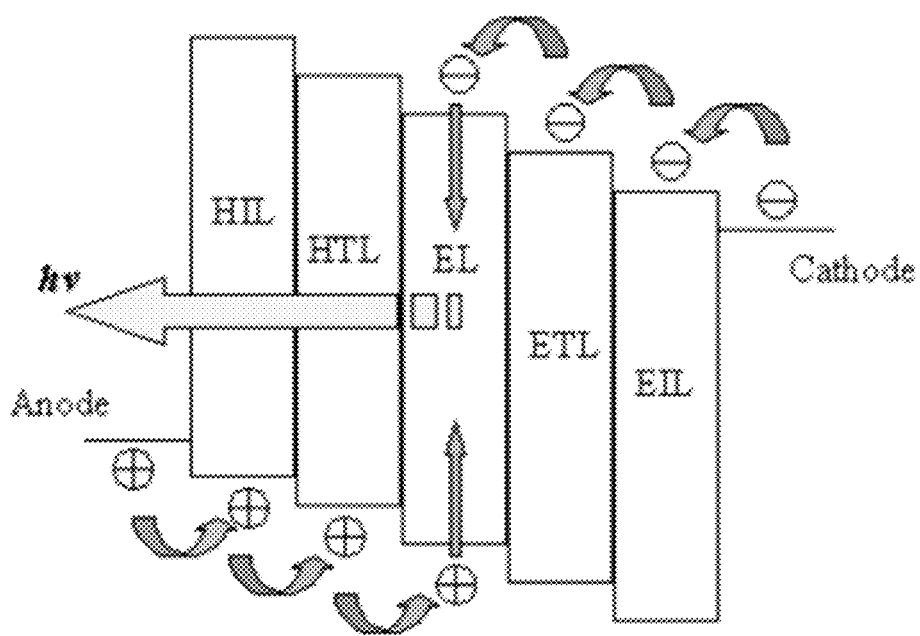
FIG. 4 illustrates an operation principle of an exemplary OLED display panel consistent with the disclosed embodiments.

FIG. 4 illustrates an operation principle of an exemplary OLED display panel consistent with the disclosed embodiments. As shown in FIG. 4, when applied with an external electric field, the electrons and holes are respectively injected from the first electrode and the second electrode into the luminescent material layer (i.e., the light-emitting layer) of the OLED display panel, and then recombined to generate excitons. The excitons migrate under the applied electric field, the energy is transferred to the light-emitting molecules in the luminescent material, and the electrons are stimulated to transit from the ground state to the excited state. The electrons at the excited state may release the energy through the radiation transition, thereby generating light.

The OLED devices shown in FIG. 2 and FIG. 3 can form the stepped energy level as shown in FIG. 4, in which the holes provided by the anode and the electrons provided by the cathode may be more easily transported to the light-emitting layer, then recombined in the light-emitting layer, resulting light emitted from the OLED display panel. In one embodiment, as shown in FIG. 2 or FIG. 3, the work function of the anode ITO may be configured to be approximately 4.5 to 4.8 eV, and may be increased to approximately 5 eV after the treatment with oxygen or ultraviolet light, which may still be approximately 0.4 eV lower than the HOMO level of most hole transport materials. Though disposing a hole injection layer between the ITO and the light-emitting layer, not only the carrier injection capability at the interface may be enhanced, but also the efficiency and life of the device may be improved.

In certain embodiments, the first auxiliary light-emitting layer may be a hole-type functional layer doped with a P-type material.

In certain embodiments, the volume percentage of the compound of the chemical formula (I) in the first auxiliary light-emitting layer may be configured to be less than or equal to approximately 10%. In the host material, when the volume percentage of the compound of the chemical formula (I) is too high (e.g., more than 10%), the hole generation rate may be substantially high. On one hand, if the electron generation rate is far less than the hole generation rate, the holes are more likely to migrate laterally to the adjacent pixel regions, and then recombined with the electrons in the adjacent pixel region in the light-emitting layer, causing light emission and resulting a lateral leakage. On the other hand, if the electron generation rate is far less than the hole generation rate, the hole density in the first auxiliary light-emitting layer may be substantially large, the probability of hole collision may be increased, which may result in hole quenching and further reduce the efficiency of the device.

In certain embodiments, the thickness of the first auxiliary light-emitting layer may be configured to be equal to or smaller than approximately 150 Å, such as 140 Å, 130 Å, 120 Å, 110 Å, 100 Å, 90 Å, 80 Å, 70 Å, and 60 Å, etc. The first auxiliary light-emitting layer having a thickness equal to or smaller than 150 Å may be able to reduce the propagation length of the holes, such that the generated holes may reach the light-emitting layer more quickly to be recombine with the electrons to emit light. Accordingly, the lateral propagation time between adjacent pixel regions in the first auxiliary light-emitting layer may be reduced, thereby reducing the crosstalk between adjacent pixel regions.

In certain embodiments, the electron acceptor group may include any one or a combination of at least two selected from cyano, fluorine, trifluoromethyl, chlorine and bromine. Thu, the electron acceptor group may have strong electron-withdrawing capability, hole-generation capability, and hole-injection capability, and the same doping amount may generate more holes. That is, the electron acceptor group with strong electron-withdrawing capability may reduce the doping volume percentage of the dopant material in the host material. On the other hand, the electron acceptor groups with strong electron-withdrawing capability may improve the hole injection capability, and reduce the turn-on voltage and power consumption of the device.

The substituted aryl groups provided by the present disclosure may include, for example, substituted phenyl groups, substituted biphenyl groups, substituted naphthyl groups, substituted methylphenyl groups, and substituted ethylphenyl groups, etc.

For illustrative purposes, the substituted aryl groups provided by the present disclosure may include but not limited to

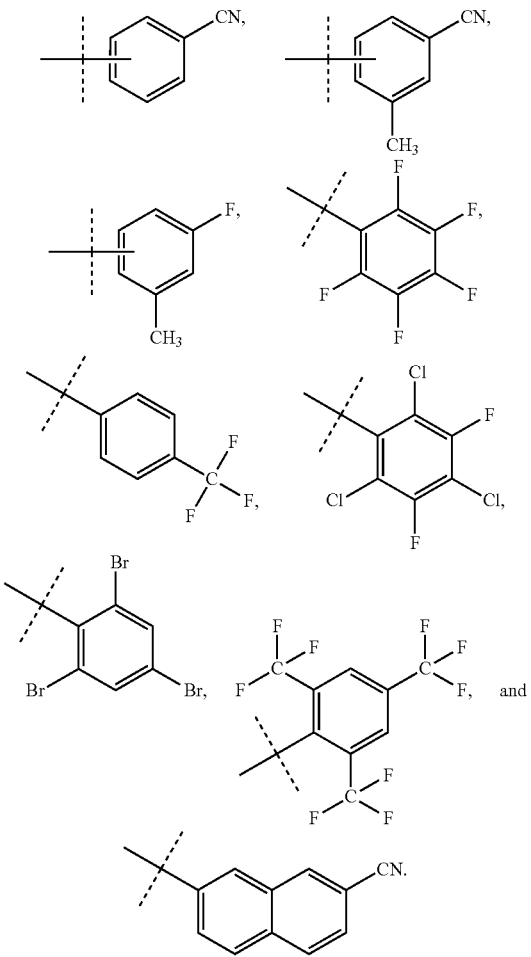

The substituted heteroaryl groups provided by the present disclosure may include, for example, substituted pyridyl, substituted furyl, substituted pyrrolyl, substituted thienyl, substituted thiazolyl, and substituted pyranyl, etc.

For illustrative purposes, the substituted heteroaryl groups provided by the present disclosure may include but not limited to

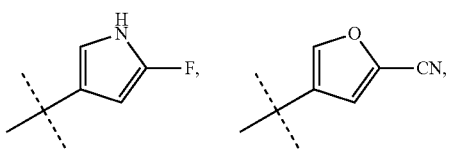

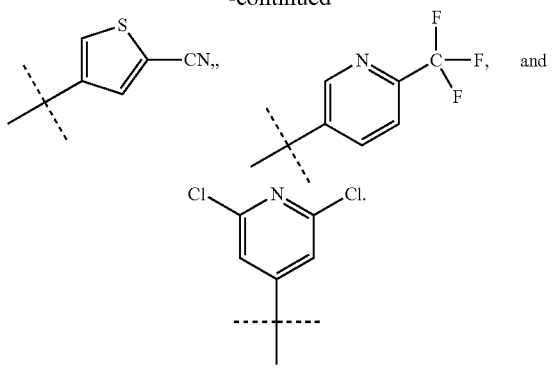

In one embodiment, the dopant material may comprise a compound of

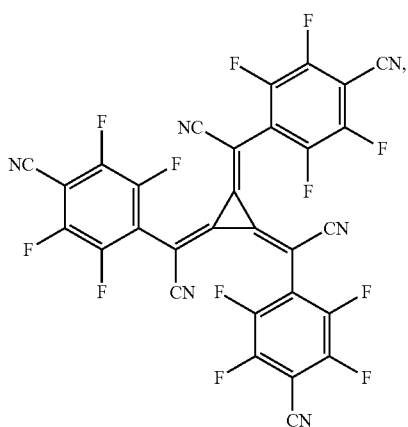 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

which may have a strong electron-withdrawing capability, hole-generation capability, and hole-injection capability. When the dopant material is doped in to the host material, the number of holes generated may be increased, thereby reducing the doping volume percentage in the host material. In addition, because the dopant material has a substantially large number of electron-withdraw groups and a strong electron-withdrawing capability, the holes are more likely to be generated. Compared to the device without the dopant material, the turn-on voltage of the disclosed OLED display panel may be lowered, and the power consumption of the OLED display panel may be reduced accordingly.

In one embodiment, the host material may comprise a compound of the following chemical formula (II):

chemical formula (II)

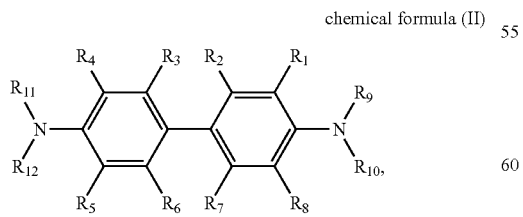

where $R_1$ to $R_8$ each may independently include any one of hydrogen, substituted or unsubstituted $C_1$ to $C_6$ alkyl group, and substituted or unsubstituted $C_5$ to $C_{15}$ aryl group, and $R_9$ to $R_{12}$ each may be independently selected from aryl group.

The substituted or unsubstituted $C_1$-$C_6$ alkyl group may include, for example, methyl, ethyl, propyl, n-butyl, isobutyl, n-pentyl, isopentyl, neopentyl, n-hexyl, and 2-methylpentyl, etc.

The substituted or unsubstituted $C_5$ to $C_{15}$ aryl group may include, for example, phenyl, tolyl, ethylphenyl, xylyl, diphenyl, naphthyl, and anthryl, etc.

The compound of the chemical formula (II) may include a substantially large number of conjugated structures, and the performance may be substantially stable. Meanwhile, in the compound of the chemical formula (II), three conjugated systems ($R_9$, $R_{10}$ and biphenyl) are attached to the nitrogen atom. Because the nitrogen atom attracts the electrons, the electron cloud can move closer to the nitrogen atom, generating more holes. The holes can move faster under the influence of the large π bonds, i.e., the holes are transported with a substantially fast speed.

That is, the holes generated in the dopant material may be rapidly transported in the host material (i.e., the compound of the chemical formula shown in formula (II)). On one hand, the transport rate of the holes in the first auxiliary light-emitting layer may be increased, and the transport time may be reduced, such that the holes and the electrons may be rapidly recombined in the light-emitting layer and, accordingly, the hole and electron injection and transportation in the OLED device may be further balanced, and the luminous efficiency of the OLED device may be improved.

On the other hand, the rapid transport of the holes in the first auxiliary light-emitting layer may reduce the distribution density of the holes in the first auxiliary light-emitting layer, such that the probability of the occurrence of holes in the adjacent pixel region may be reduced, and the probability of the holes to be recombined with the electrons in the light-emitting layer of the adjacent pixels may be reduced. Accordingly, the lateral leakage may be suppressed.

In one embodiment, $R_9$, $R_{10}$, $R_{11}$, $R_{12}$ each may be independently selected from substituted or unsubstituted phenyl, substituted or unsubstituted biphenyl, substituted or unsubstituted condensed-ring groups, and substituted or unsubstituted heterocyclic aryl.

In one embodiment, $R_9$, $R_{10}$, $R_{11}$, $R_{12}$ each may independently include any one of

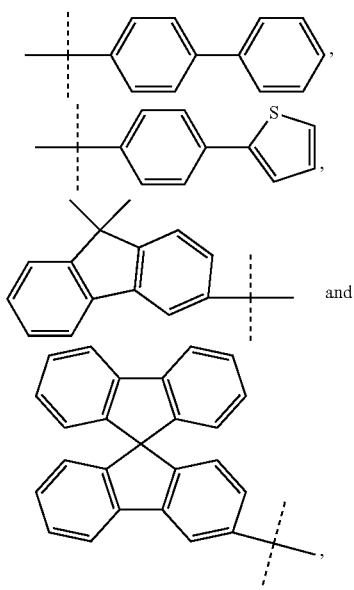

which may have the conjugate structure and may be rigid material with good molecular thermal stability. The formed host material may improve the stability of the device.

In one embodiment, the OLED display panel may further comprise a second auxiliary light-emitting layer disposed between the light-emitting layer and the cathode, and the material of the second auxiliary light-emitting layer may at least comprise a first electron type material, which may at least comprise a first group. The first group may have a conjugated structure containing at least three consecutive benzene rings, in which at least one of the carbon atoms on the three consecutive benzene rings may be substituted with a nitrogen atom. In addition, the first group may have an axisymmetric structure. For example, the first group may include

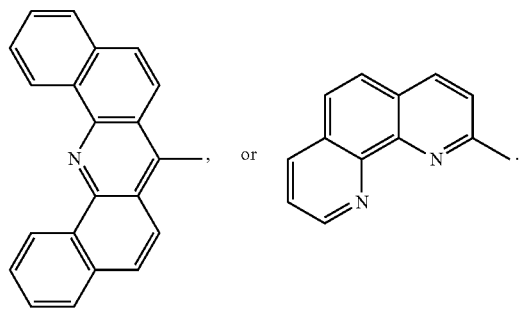 [SMILES: Cc1c2ccc3ccccc3c2nc2c1ccc1ccccc12 ; Cc1ccc2ccc3cccnc3c2n1]

Through adopting at least one of the electron injection material and electron transport material, the drive voltage and power consumption of the device may be effectively reduced, while the luminous efficiency of the device may be significantly improved. However, the optimum thickness of the electron injection material and transport material is often configured to be less than approximately 1.0 nm, which may be difficult to control in the vapor deposition. Doping the electron injection material (e.g., Liq) into the electron transport material may facilitate the vapor deposition, however, the driving voltage of the fabricated device may be substantially high. For example, referring to the 7$^{th}$ disclosed device in Table 1, the driving voltage of the fabricated device in which Liq is doped into the ETL is generally 0.5 V higher than the driving voltage of the fabricated device in which metal elements are doped into the first electron type material.

In the disclosed embodiments, the first electron type material having an electron transport property may be adopted in the OLED device. The first electron type material may be configured to transport electrons, improve the electron transport rate, lower the turn-on voltage, such that the number of electrons and holes in the light-emitting layer may be matched, and the luminous efficiency of the device may be improved.

In one embodiment, the second auxiliary light-emitting layer may be doped with an N-type dopant material. For example, the N-type dopant material may be a second main group metal and compound, a third main group metal and compound or a rare earth metal. Further, the N-type dopant material may be ytterbium. In one embodiment, the doping volume ratio of the N-type dopant material may be configured to be approximately in the range of 1% to 5%, such as 2%, 3%, and 4%, etc.

Due to the active outer electrons, the II main group element ion, the third main group element ion or the rare earth element ion are easily to be bonded to the electronic material having the first group. Based on the large π bond of the first electron type material, the electron injection capability is strong, and the electron transport rate is substantially high. In addition, the atomic radius of ytterbium is substantially large, the attraction of the outer electrons is weak. Thus, the outer electrons are easily distributed at the large π bond of the first electronic type material, thereby increasing the electron transport rate. The high electron transport rate enables the electrons to be rapidly transported to the light-emitting layer, and to be recombined with the holes in the first auxiliary light-emitting layer to emit light.

On the other hand, the doping volume ratio or percentage of the N-type dopant material determines the number of the holes injected into. Given sufficient holes, the number of carriers may increase as the number of the injected holes increases, thereby improving the luminous efficiency of the device. Thirdly, through doping the N-type dopant materials, the number of the injected holes may be increased, the electron injection rate may be improved, and the device voltage may be reduced.

It should be noted, in the disclosed embodiments, the second auxiliary light-emitting layer may be configured as one or more layers of an electron injection layer (EIL), an electron transport layer (ETL), and a hole blocking layer (HLI) in the OLED display panel, which may be determined according to the design of the OLED display panels in practical applications and is not limited by the present disclosure.

The first electrode may be selected as, for example, an ITO electrode. The second electrode may include, for example, any one or a combination of at least two selected from magnesium, aluminum and silver.

In one embodiment, the light-emitting layer may include any one or a combination of at least two selected from a blue light-emitting unit, a green light-emitting unit, a red light-emitting unit, a yellow light-emitting unit and a white light-emitting unit. The light-emitting layer may comprise a host material (host) and a guest/dopant material (dopant). It should be understood by those skilled in the art that the volume percentage of the host in the light-emitting layer is greater than the volume percentage of the dopant.

In general, the absolute value of the HOMO level of the host is greater than the absolute value of the HOMO level of the dopant, i.e., |T_host (HOMO)|>|T_dopant (HOMO)|, the absolute value of the LUMO level of the host is smaller than the absolute value of the LUMO level of the dopant, i.e., |T_host(LUMO)|<|T_dopant (LUMO)|, and the triplet energy level of the host is greater than the triplet energy level of the dopant, i.e. T_host(S)>T_dopant(S). The energy of the triplet exciton of the host can be effectively transferred to the dopant, and the emission spectrum of the host and the absorption spectrum of the dopant can match from the energy aspect.

In addition, the luminescent material of the light-emitting layer may include a phosphorescent or a fluorescent material. For example, in one embodiment, the luminescent material of the green light-emitting unit and the red light-emitting unit may be a phosphorescent material, and the luminescent material of the blue light-emitting unit may be a fluorescent material. The luminescent material of the light-emitting layer may also include, for example, a non-host-guest material or a thermotropic activated delayed fluorescence (TADF) luminescent material, which is not limited by the present disclosure.

In one embodiment, the blue light-emitting unit, the green light-emitting unit, and the red light-emitting unit may each independently select the host material and the dopant material.

The term "each independently" means that the host material and the dopant material may be the same or different for the blue light-emitting unit, the green light-emitting unit, and the red light-emitting unit.

In one embodiment, the red light-emitting unit may include one or two host materials, the green light-emitting unit may include two or more than two host materials, and the blue light-emitting unit may include one or two host materials.

In one embodiment, the second electrode may include any one of magnesium silver alloy, silver, silver ytterbium alloy and silver rare earth metal alloy. The material of the second electrode may be determined according to various application scenarios, provided that the light-emitting units of different colors maintain a balanced light transmittance.

Figure 5:
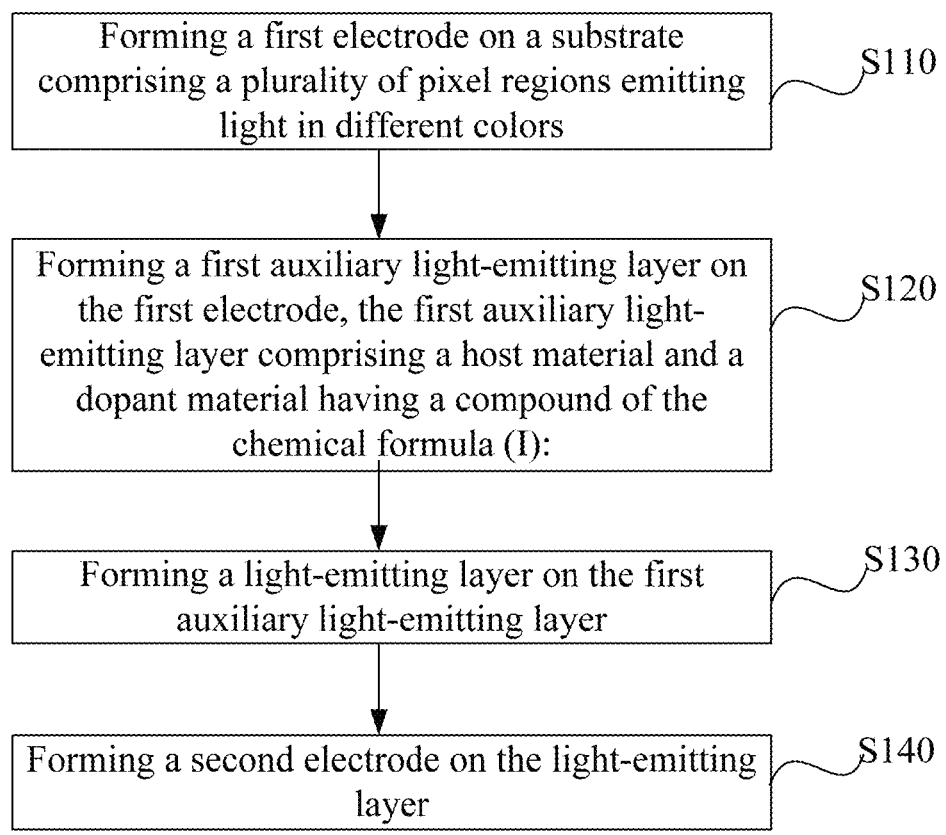
FIG. 5 illustrates a flow chart of an exemplary OLED display panel fabrication method consistent with the disclosed embodiments.

The present disclosure also provides an OLED display panel fabrication method. FIG. 5 illustrates a flow chart of an exemplary OLED display panel fabrication method consistent with the disclosed embodiments.

As shown in FIG. 5, at the beginning, a first electrode is formed on a substrate including a plurality of pixel regions emitting light in different colors (S110).

The corresponding structure is shown in FIG. 2. As shown in FIG. 2, the first electrode 101 may be deposited on the substrate 100. In one embodiment, the first electrode 101 may be a reflective electrode composed of, for example, silver or magnesium or magnesium alloy. In another embodiment, the first electrode 101 may be a transparent conductive electrode having a high work function and facilitating the hole injection, such as indium tin oxide (ITO) or indium zinc oxide (IZO).

In one embodiment, after the first electrode 101 is formed on the substrate 100, a pixel defining layer (not drawn in FIG. 2) may be formed on the first electrode 101. The pixel defining layer may include a plurality of openings, and each opening may correspond to a pixel region. The pixel region may be any appropriate unit of display for displaying an image or an image element. For example, the pixel region may be a pixel or a subpixel of an image.

In another embodiment, a pixel defining layer may be formed on the substrate 100 before forming the first electrode 101. The pixel defining layer may comprise a plurality of openings, and the first electrode 101 may be formed in each of the openings. The pixel defining layer may prevent the color mixing in the subsequently formed light-emitting layers.

Returning to FIG. 5, after the first electrode is formed on the substrate, a first auxiliary light-emitting layer is formed on the first electrode (S120). The corresponding structure is shown in FIG. 2.

As shown in FIG. 2, the first auxiliary light-emitting layer 104 may be formed on the first electrode 101. The first auxiliary light-emitting layer 104 may comprise a host material and a dopant material, and the dopant material may comprise a compound of the following chemical formula (I):

chemical formula (I)

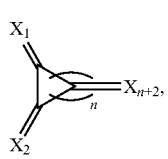

where n is an integer equal to or larger than 1, $X_1$, $X_2$ and $X_{n+2}$ each may independently have a chemical structure of

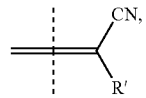

R' may be selected from any one of a substituted aryl group and a substituted heteroaryl group, in which a substituent in the substituted aryl group and a substituent in the substituted heteroaryl group each may include at least one electron acceptor group. For example, the electron acceptor group may include any one or a combination of at least two selected from cyano, fluorine, trifluoromethyl, chlorine and bromine.

In one embodiment, the dopant material may comprise a compound of

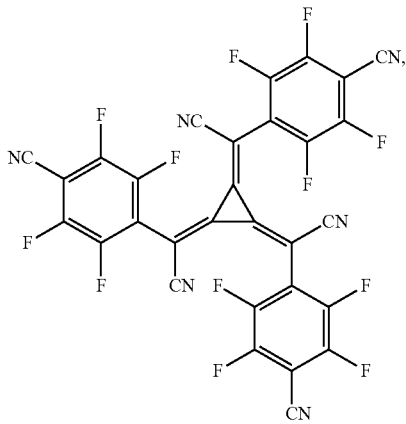 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

and the host material may comprise a compound of the following chemical formula (II):

chemical formula (II)

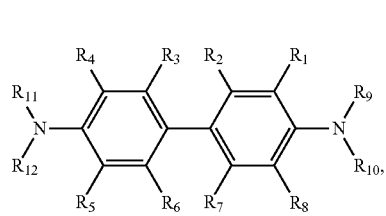

where $R_1$ to $R_8$ each may independently include any one of hydrogen, substituted or unsubstituted $C_1$ to $C_6$ alkyl group, and substituted or unsubstituted $C_5$ to $C_{15}$ aryl group, and $R_9$ to $R_{12}$ each may be independently selected from aryl group. $R_9$, $R_{10}$, $R_{11}$, $R_{12}$ each may be independently selected from substituted or unsubstituted phenyl, substituted or unsubstituted biphenyl, substituted or unsubstituted condensed-ring groups, and substituted or unsubstituted heterocyclic aryl. For example, $R_9$, $R_{10}$, $R_{11}$, $R_{12}$ each may independently include any one of

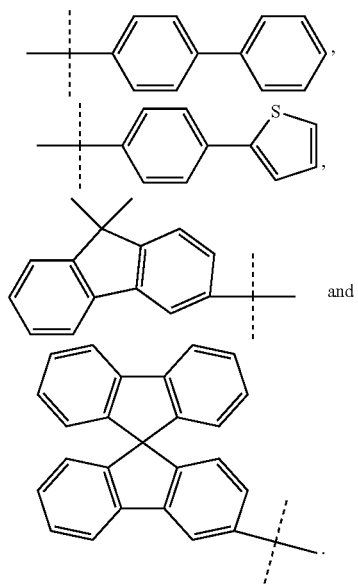

Further, the first auxiliary light-emitting layer may comprise, for example, a hole injection buffer layer, a hole injection layer (HIL), a hole transport layer (HTL), an electron blocking layer (EBL) of the OLED display panel. In certain embodiments, the first auxiliary light-emitting layer may also include other appropriate layers of the OLED display panel.

In one embodiment, in each pixel region, the thickness of the hole injection buffer layer may be configured to be equal to or smaller than approximately 150 Å, the thickness of the hole injection layer (HIL) may be configured to be equal to or smaller than approximately 1000 Å, and the thickness of the hole transport layer (HTL) may be configured to be equal to or smaller than approximately 700 Å.

Returning to FIG. 5, after the first auxiliary light-emitting layer is formed on the first electrode, a light-emitting layer is formed on the first auxiliary light-emitting layer (S130). The corresponding structure is shown in FIG. 2.

As shown in FIG. 2, the light-emitting layer 103 may be deposited on the first auxiliary light-emitting layer 104. For the pixel regions emitting light in different colors, the light-emitting layers may be deposited respectively through a mask. For example, the pixel regions emitting light in different colors may include a blue light-emitting pixel region, a green light-emitting pixel region, and a red light-emitting pixel region.

The light-emitting layers in the pixel regions emitting light in different colors may have same or different thickness, which may be determined according to the actual process requirements, the structure of the respective light-emitting color pixel regions, the characteristics of the light-emitting layer, and the balance between the hole and electron transport in the respective pixel region.

Returning to FIG. 5, after the light-emitting layer is formed on the first auxiliary light-emitting layer, a second electrode is formed on the light-emitting layer (S140). The corresponding structure is shown in FIG. 2.

As shown in FIG. 2, the second electrode 102 may be disposed on the light-emitting layer 103. In one embodiment, the second electrode 102 may be made of a conductive material having a low work function, which may facilitate the hole injection.

In one embodiment, the first electrode and the second electrode each may include a plurality of striped-electrodes arranged in parallel, and the striped-electrodes in the first electrode may intersect the striped-electrodes in the second electrode, which may be adopted for an active OLED display panel. In another embodiment, the first electrode may include a plurality of sheet electrodes arranged in a matrix, and the second electrode may be a planar sheet electrode, i.e., all the pixel regions have the same electrode, which may be adopted for a passive OLED display panel.

In one embodiment, forming the second electrode on the light-emitting layer may further comprise: forming a second auxiliary light-emitting layer on the light-emitting layer; and forming the second electrode on the second auxiliary light-emitting layer. The corresponding structure is shown in FIG. 3.

As shown in FIG. 3, the second auxiliary light-emitting layer 205 may be disposed on the light-emitting layer 203, and the second electrode 202 may be formed on the second auxiliary light-emitting layer 205.

In one embodiment, the second auxiliary light-emitting layer 205 may be disposed at the pixel region corresponding to at least one colored light, and the second auxiliary light-emitting layer 205 may be doped with an N-type dopant material. Through doping the N-type dopant material into the second auxiliary light-emitting layer, the electron mobility in the second auxiliary light-emitting layer may be enhanced, thereby balancing the recombination of the two carriers in the light-emitting layer.

It should be noted that, in the disclosed embodiments, the second auxiliary light-emitting layer 205 may be configured as one or more layers of an electron injection layer (EIL), an electron transport layer (ETL), and a hole blocking layer (HBL) in the OLED display panel, which may be determined according to the design of the OLED display panels in practical applications and is not limited by the present disclosure.

In the disclosed embodiments, the OLED display panel may be a top emission type, a bottom emission type, or a double emission type, which is not limited by the present disclosure. When the second electrode is the light exiting side of the OLED display device, the first electrode may include at least one reflective electrode and at least one transparent conductive electrode. The transparent conductive electrode may be made of, for example, indium tin oxide (ITO), and the reflective electrode may be made of, for example, Ag or Ag alloy.

In one embodiment, the multiple films in the OLED display panel may be fabricated by any one or at least a combination of two selected from vapor deposition, printing, spin coating and ink jet printing.

In one embodiment, in the first auxiliary light-emitting layer, the doping volume percentage of the compound of the chemical the formula (I) may be less than or equal to approximately 10%.

In one embodiment, in the second auxiliary light-emitting layer, the doping volume percentage of the N-type dopant material may be approximately in the range of 1% to 5%.

Figure 6:
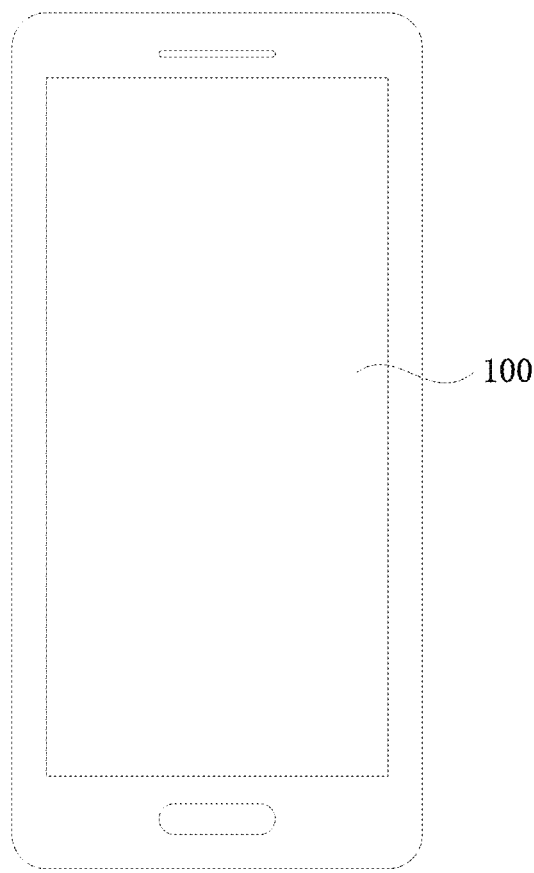
FIG. 6 illustrates an exemplary electronic device consistent with the disclosed embodiments.

The present disclosure also provides an electronic device. FIG. 6 illustrates an exemplary electronic device consistent with the disclosed embodiments. As shown in FIG. 6, the electronic device may comprise an OLED display panel 100, which may be any one of the disclosed OLED display panels. The electronic device may be a mobile phone, a computer, a television, a tablet, and a smart wearable device, etc., which is not limited by the present disclosure.

The present disclosure also provides a performance test for ten disclosed OLED devices and three reference OLED devices. The performance test may include: measuring the voltage and efficiency of the devices by an IVL tester (Model: M6100 Supplier: McScience); measuring the current of the devices under different voltages by a digital nanovoltmeter (Model: Keithley 2365A), dividing the current by the light-emitting area to obtain the current density of the devices under different voltages; and measuring the luminance and radiant energy density of the devices under different voltages by a spectroradiometer (Model: Konicaminolta CS-2000). According to the current density and luminance of the OLED device under different voltages, the current efficiency (Cd/A) and the external quantum efficiency (EQE) under the same current density (0.1 mA/cm$^2$) may be obtained.

Figure 7:
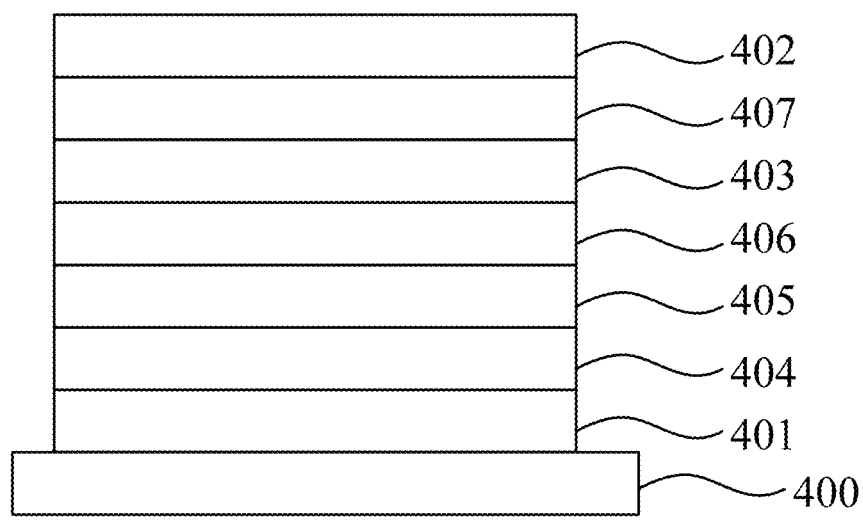
FIG. 7 illustrates a schematic cross-sectional view of an OLED display panel used for performance testing of exemplary OLED display panels and reference display panels.

The disclosed OLED devices and reference OLED devices may have a same structure, as shown in FIG. 7, which may comprise a substrate 400, and a first electrode 401, a hole injection buffer layer 404, a hole injection layer (HIL) 405, a hole transport layer (HTL) 406, a light-emitting layer 403, an electron transport layer (ETL) 407, and a second electrode 402 sequentially disposed on the substrate 400. The hole injection buffer layer 404 shown in FIG. 7 may be configured as the first electron-type auxiliary light-emitting layer in the disclosed embodiments. The hole injection layer (HIL) 405, the hole transport layer (HTL) 406, the light-emitting layer 403, the electron transport layer (ETL) 407, and the second electrode 402 in the respective disclosed OLED devices and respective reference OLED devices may have the same thickness and the same material.

In particular, the first electrode 401 is made of indium zinc oxide (ITO). The hole injection layer (HIL) 405 is made of NPB

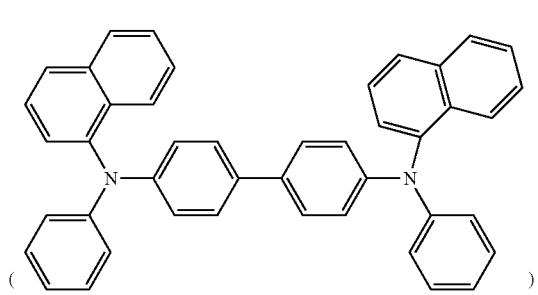 [SMILES: c1ccc(N(c2ccc(-c3ccc(N(c4ccccc4)c4cccc5ccccc45)cc3)cc2)c2cccc3ccccc23)cc1]

( )

and have a thickness of approximately 800 Å. The hole transport layer (HTL) 406 is made of TAPC

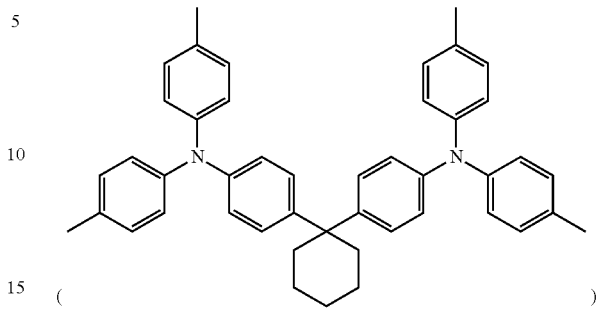

( )

and have a thickness of approximately 400 Å. The light-emitting layer 403 is made of DPVPA

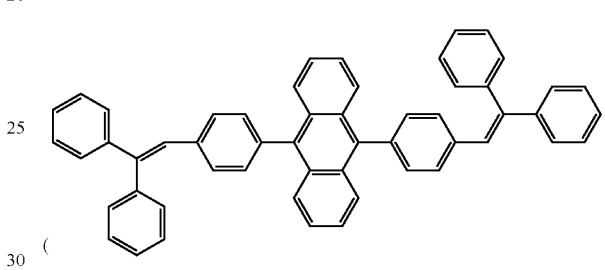

( )

and BCzVB

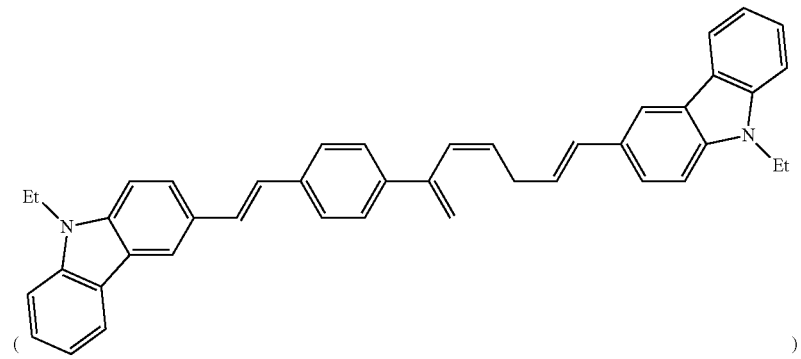 [SMILES: C=C(/C=C\C/C=C/c1ccc2c(c1)c1ccccc1n2CC)c1ccc(/C=C/c2ccc3c(c2)c2ccccc2n3CC)cc1]

( )

and have a thickness of approximately 300 Å, and the volume percentage of DPVPA and BCzVB is 5%. The electrode transport layer (ETL) 407 has a host material of

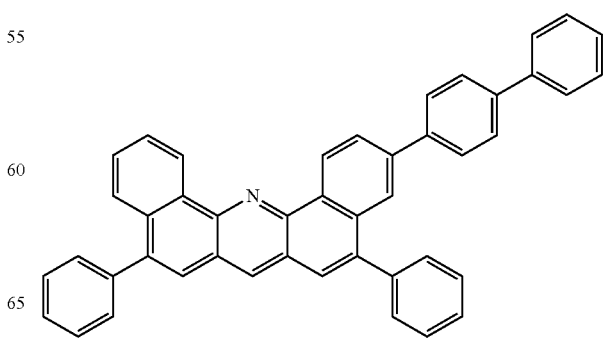

and the dopant is shown in Table 1 and Table 2, the thickness of the electrode transport layer (ETL) 407 is approximately 300 Å. The second electrode 402 is made of Ag, and have a thickness of approximately 1000 Å.

The difference between the disclosed OLED devices and reference OLED devices is that the material of the hole injection buffer layer 404 and the electron transport layer (ETL) 407 is different, and the thickness of the hole injection buffer layer 404 is different, as shown in Table 1 and Table 2, respectively.

TABLE 1

Testing results of disclosed and reference devices

| | Hole injection buffer layer | | | | | |
|---|---|---|---|---|---|---|
| | Material | Thickness (Å) | HIL | ETL | Voltage/V | EQE/% |
| 1st disclosed device | A1:B1(1%) | 100 | A1 | ETL:Yb(1%) | 3.75 | 8.11 |
| 2nd disclosed device | A1:B1(5%) | 100 | A1 | ETL:Yb(1%) | 3.62 | 7.88 |
| 3rd disclosed device | A1:B1(10%) | 100 | A1 | ETL:Yb(1%) | 3.45 | 7.64 |
| 4th disclosed device | A1:B1(10%) | 100 | A1 | ETL:Yb(3%) | 3.38 | 8.20 |
| 5th disclosed device | A1:B1(10%) | 100 | A1 | ETL:Yb(5%) | 3.59 | 7.46 |
| 6th disclosed device | A1:B1(10%) | 100 | A1 | ETL:Mg(3%) | 4.02 | 7.23 |
| 7th disclosed device | A1:B1(10%) | 100 | A1 | ETL:Liq(3%) | 4.45 | 7.01 |
| 8th disclosed device | A2:B2(5%) | 150 | A2 | ETL:Yb(3%) | 3.66 | 8.01 |
| 9th disclosed device | A3:B3(5%) | 70 | A3 | ETL:Yb(3%) | 3.68 | 7.95 |
| 10th disclosed device | A1:B1(5%) | 100 | A1 | ETL:Yb(6%) | 3.78 | 7.02 |
| 1st reference device | A1:B1(10%) | 160 | A1 | ETL:Yb(3%) | 4.20 | 6.85 |
| 2nd reference device | A1 | 100 | A1 | ETL:Yb(1%) | 4.68 | 7.23 |
| 3rd reference device | A1:B1(12%) | 100 | A1 | ETL:Yb(1%) | 3.45 | 7.40 |

TABLE 2

Chart of the codes in Table 1 and the materials presented by the codes

Code     Material

A1

A2

TABLE 2-continued

Chart of the codes in Table 1 and the materials presented by the codes

Code     Material

A3

B1

TABLE 2-continued

Chart of the codes in Table 1 and the materials presented by the codes

| Code | Material |
|---|---|
| B2 | (structure) |
| B3 | (structure) |
| ETL | (structure) |
| LiQ | 8-hydroxyquinoline-lithium |
| Yb | ytterbium |
| Mg | magnesium |

Table 1 shows the performance testing results of each disclosed and reference device. Table 2 is a chart showing the codes in Table 1 and the materials presented by the codes. In Table 1, in the hole injection buffer layer, A (including A1, A2, A3) denotes the host material, B (including B1, B2, B3) denotes the dopant material, and the ratio in parentheses is the doping volume ratio of B in A. For example, A1:B1(1%) represents the doping volume ratio of B1 in A1 is 1%. The host material of the electron transport layer (ETL) is ETL, and the ratio in parentheses is the doping volume ratio of the dopant in the host. For example, ETL:Yb (1%) represents the doping volume ratio of Yb in ETL is 1%.

As shown in Table 1 and Table 2, the $1^{st}$, $8^{th}$, and $9^{th}$ disclosed devices have a hole injection buffer layer, in which compounds B1 to B3 of the chemical formula (I) are respectively doped into the host material. The luminous efficiency of the devices is improved. The reasons may be explained as follows: the compound of the chemical formula (I) may have a strong electron-withdrawing capability, resulting more holes, increasing the hole injection rate, and enabling the holes to transport rapidly to the light-emitting layer to be recombined with the electrons to emit light. Thus, the power consumption of the OLED panel may be reduced as compared to the $2^{nd}$ reference device without any dopant.

On the other hand, through respectively doping the compound B1 to B3 of the chemical formula (I) into the host material in the $1^{st}$, $8^{th}$, and $9^{th}$ disclosed devices, the hole injection capability may be improved, the number of the carriers generated from recombing the holes and electrons in the light-emitting layer may be increases, the hole and electron injection and transport may be further balanced.

The turn-on voltage of the devices (e.g., the $1^{st}$-$3^{rd}$ disclosed devices) whose hole injection buffer layer has 1 to 10% doping volume ratio of B1 to B3 of the chemical formula (I) is lowered to approximately 3.45V to 3.75V, and the external quantum efficiency (EQE) is increased to approximately 7.64% to 8.11%, because the number of hole injected is effectively increased, the hole transport rate is effectively improved, and more carriers are generated in the light-emitting layer.

The EQE of the $10^{th}$ disclosed device is lower than the EQE of the $2^{nd}$ disclosed device by approximately 0.86%, and the EQE of the $5^{th}$ disclosed device is lower than the EQE of the $4^{th}$ disclosed device by approximately 0.7%. Because when the doping volume ratio of Yb increases, the electron injection and transport rate increases, while the turn-on voltage of the device is reduced, however, Yb as a metal atom decreases the light transmittance. That is, for the cathode light-emitting devices, a substantially large doping volume ratio of Yb will slightly decrease the EQE of the OLED device.

The EQE of the $6^{th}$ disclosed device (ETL-doped magnesium) and the $7^{th}$ disclosed device (ETL doped with Liq) are respectively lower than the EQE of the $4^{th}$ disclosed device (ETL doped with ytterbium), and the voltage of the $6^{th}$ disclosed device and the $7^{th}$ disclosed device are respectively slightly higher than the voltage of the $4^{th}$ disclosed device. Because Mg and Liq can increase the number of carriers in the light-emitting layer, reduce the turn-on voltage of the device, and improve the luminous efficiency of the device. However, the atomic radius in Mg and Liq is substantially small and the electron injection capability is not as good as Yb. Compared with the Yb-doped device, the efficiency of the Mg- or Liq-doped device is slightly lower and the voltage is slightly higher.

The EQE of the $1^{st}$ reference device is lower than 7.0%, because the thickness of the hole injection buffer layer of the $1^{st}$ reference device is substantially large, increasing the transport path of the holes. Thus, the holes may need more time to reach the light-emitting layer, decreasing the EQE of the device.

The hole injection buffer layer in the $2^{nd}$ reference device is not doped with an radialene compound. As compared to the $1^{st}$ reference device whose hole injection buffer layer is doped with the radialene compound, the voltage of the $2^{nd}$ reference device is significantly increased and the EQE is significantly reduced. This is because when the number of holes is decreased, a higher voltage is required to allow the holes to be transported to the light-emitting layer.

In the $3^{rd}$ reference device, the doping volume ratio of the radialene compound in the hole injection buffer layer is 12% (more than 10%), as compared to the $3^{rd}$ disclosed device where the doping volume ratio of the radialene compound in the hole injection buffer layer is 10%, the voltage of the $3^{rd}$ reference device is substantially the same, while the EQE of the $3^{rd}$ reference device is slightly reduced. This is because a substantially high doping volume ratio of the radialene compound in the hole injection buffer layer may result a dense distribution of the holes which, in turn, reduces the EQE of the device. In addition, due to the strong electron-withdrawing capability of the radialene compound, a substantially doping volume ratio of the radialene compound in the hole injection buffer layer may result a severe lateral leakage in the OLED device.

In the disclosed embodiments, the first auxiliary light-emitting layer may be formed by doping a radialene compound of the chemical formula (I) into the host material as a dopant material. The radialene compound has substantially strong hole injection capability, which improves the hole injection speed, such that the holes and electrons may migrate to and recombine in the light-emitting layer to emit light under a substantially low voltage. Accordingly, the operation voltage of the device may be lowered, and the power consumption of the OLED display panel may be reduced.

In addition, as compared with the existing OLED devices, the disclosed OLED device doped with the radialene compound may further balance the hole and electron injection and transport, increase the number of the excitons generated from recombining the holes and electrodes, thereby improving the luminous efficiency of the OLED device. Through doping the radialene compound of the chemical formula (I) into the host material as a dopant material, the concentration of the radialene compound in the auxiliary light-emitting layer may be reduced. Thus, the distribution density of the holes in the auxiliary light-emitting layer may be reduced, the generated holes may be rapidly recombined with the electrons in the light-emitting light to emit light, the probability of the holes to be recombined with the electrons in the light-emitting layer of the adjacent pixels may be reduced. Accordingly, the lateral leakage may be suppressed.

It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An organic light-emitting diode (OLED) display panel, comprising:
a first electrode, a hole injection buffer layer, a hole injection layer, a hole transport layer, a light-emitting layer, an electron transport layer, and a second electrode sequentially stacked on a substrate, wherein:

the hole injection buffer layer is a first auxiliary light-emitting layer, and the electron transport layer is a second auxiliary light-emitting layer;

the first auxiliary light-emitting layer includes a host material and a dopant material, and the dopant material includes a compound of the following chemical formula:

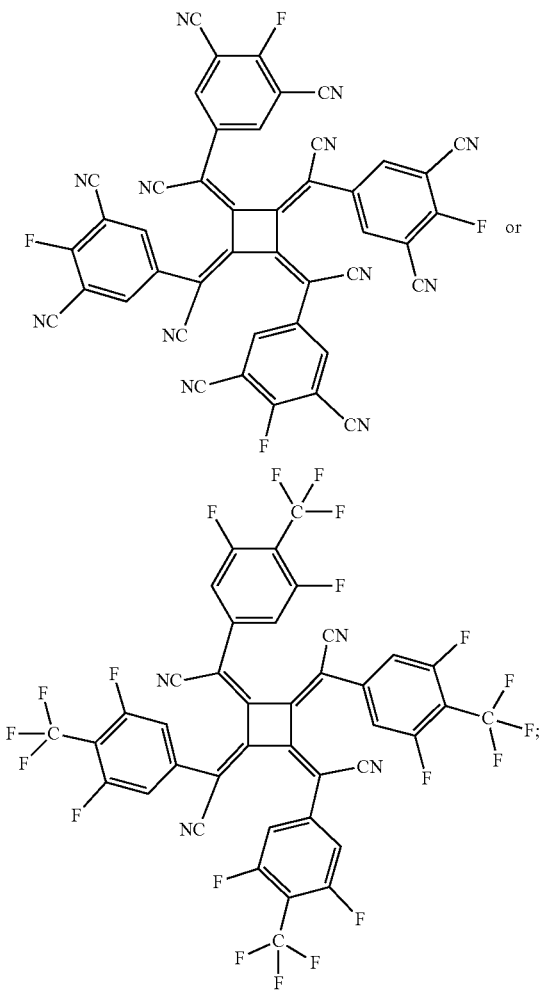

and the host material includes a compound of the following chemical formula:

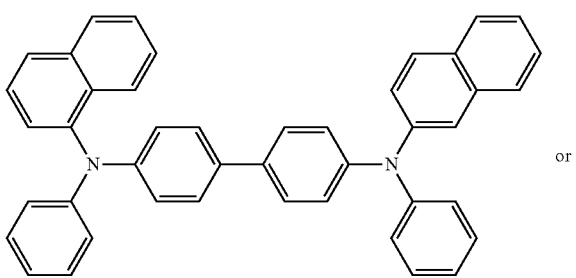

or

-continued

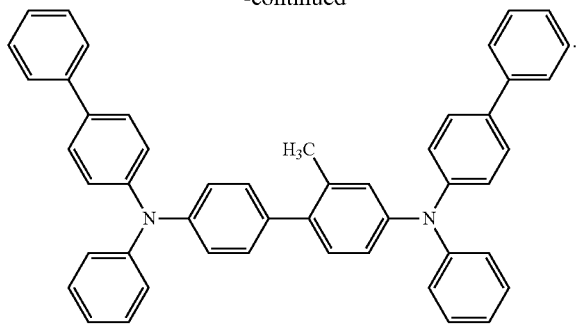

2. The OLED display panel according to claim 1, wherein:
in the first auxiliary light-emitting layer, the dopant material has a volume percentage of less than or equal to approximately 10%.

3. The OLED display panel according to claim 1, wherein:
the first auxiliary light-emitting layer has a thickness of equal to or smaller than approximately 150 Å.

4. The OLED display panel according to claim 1, wherein the second auxiliary light-emitting layer at least comprises a first electron type material.

5. The OLED display panel according to claim 4, wherein:
the first electron type material at least comprises a first group,
wherein the first group has a conjugated structure containing at least three consecutive benzene rings, and at least one of carbon atoms on the at least three consecutive benzene rings is substituted with a nitrogen atom.

6. The OLED display panel according to claim 5, wherein:
the first group comprise

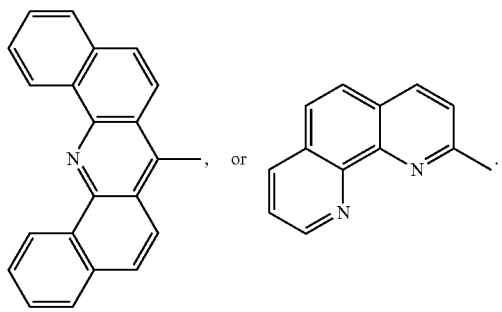 [SMILES: Cc1c2ccc3ccccc3c2nc2c1ccc1ccccc12 ; Cc1ccc2ccc3cccnc3c2n1]

7. The OLED display panel according to claim 1, wherein:
the second auxiliary light-emitting layer is doped with an N-type dopant material.

8. The OLED display panel according to claim 7, wherein:
the N-type dopant material is a second main group metal and compound, a third main group metal and compound or a rare earth metal.

9. The OLED display panel according to claim 8, wherein:
the N-type dopant material is ytterbium.

10. The OLED display panel according to claim 7, wherein:
in the second auxiliary light-emitting layer, the N-type dopant material has a doping volume percentage of approximately 1%-5%.

11. An electronic device, comprising:
an organic light-emitting diode (OLED) display panel that includes:
a first electrode, a hole injection buffer layer, a hole injection layer, a hole transport layer, a light-emitting layer, an electron transport layer, and a second electrode sequentially stacked on a substrate, wherein:
the hole injection buffer layer is a first auxiliary light-emitting layer, and the electron transport layer is a second auxiliary light-emitting layer;
the first auxiliary light-emitting layer includes a host material and a dopant material, and the dopant material includes a compound of the following chemical formula:

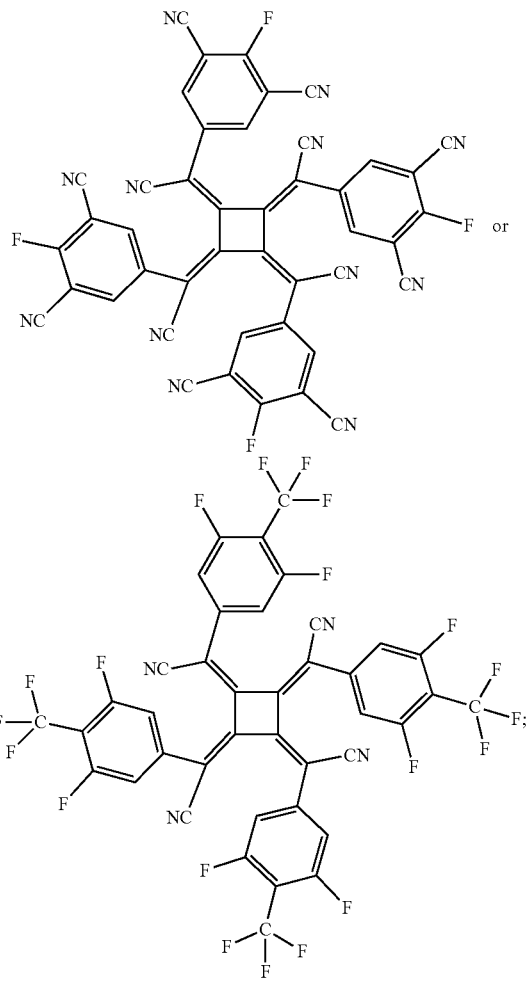

and
the host material includes a compound of the following chemical formula:

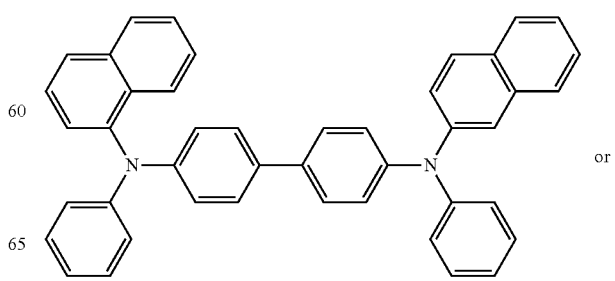

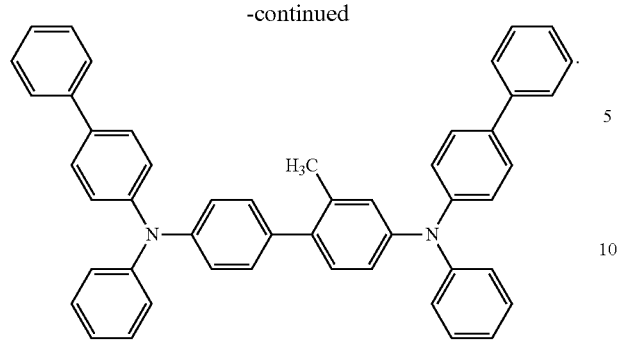
* * * * *